(12) United States Patent
Mokuno et al.

(10) Patent No.: US 9,410,241 B2
(45) Date of Patent: Aug. 9, 2016

(54) METHOD FOR SEPARATING SURFACE LAYER OR GROWTH LAYER OF DIAMOND

(75) Inventors: Yoshiaki Mokuno, Ikeda (JP); Akiyoshi Chayahara, Ikeda (JP); Hideaki Yamada, Ikeda (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 1345 days.

(21) Appl. No.: 12/439,887

(22) PCT Filed: Aug. 31, 2007

(86) PCT No.: PCT/JP2007/067023
§ 371 (c)(1),
(2), (4) Date: Mar. 4, 2009

(87) PCT Pub. No.: WO2008/029736
PCT Pub. Date: Mar. 13, 2008

(65) Prior Publication Data
US 2010/0206217 A1 Aug. 19, 2010

(30) Foreign Application Priority Data
Sep. 4, 2006 (JP) .................................. 2006-238402

(51) Int. Cl.
*C23C 16/01* (2006.01)
*C23C 16/27* (2006.01)
(Continued)

(52) U.S. Cl.
CPC .................. *C23C 16/01* (2013.01); *C23C 16/27* (2013.01); *C23C 16/56* (2013.01); *C25F 3/00* (2013.01); *C30B 29/04* (2013.01); *C30B 31/22* (2013.01); *C30B 33/06* (2013.01)

(58) Field of Classification Search
None
See application file for complete search history.

(56) References Cited

U.S. PATENT DOCUMENTS 3,870,033 A * 3/1975 Faylor et al. .................. 392/470
5,269,890 A * 12/1993 Marchywka .................. 205/665
(Continued)

FOREIGN PATENT DOCUMENTS

| JP | 10-50644 A | 2/1998 |
| JP | 2001-509839 A | 7/2001 |
| JP | 2005-272197 A | 10/2005 |

OTHER PUBLICATIONS

International Search Report of PCT/JP2007/067023, date of mailing Oct. 23, 2007.
(Continued)

*Primary Examiner* — Melvin C Mayes
(74) *Attorney, Agent, or Firm* — Westerman, Hattori, Daniels & Adrian, LLP

(57) ABSTRACT

The present invention provides a method for separating a surface layer of a diamond, which comprises implanting ions into a diamond to form a non-diamond layer near a surface of the diamond; and etching the non-diamond layer in the diamond by applying an alternating-current voltage across electrodes in an electrolytic solution; and a method for separating a grown layer of a diamond, which further comprises the step of growing a diamond by a vapor-phase synthesis method, after forming a non-diamond layer according to the above-described method. The invention is applicable to various single-crystal and polycrystal diamonds. More specifically, even with a large single-crystal diamond, a portion of the single-crystal diamond can be efficiently separated in a reusable form in a relatively short period of time.

10 Claims, 1 Drawing Sheet

(51) Int. Cl.

| | |
|---|---|
| *C23C 16/56* | (2006.01) |
| *C25F 3/00* | (2006.01) |
| *C30B 29/04* | (2006.01) |
| *C30B 31/22* | (2006.01) |
| *C30B 33/06* | (2006.01) |

(56) References Cited

U.S. PATENT DOCUMENTS

| | | | | |
|---|---|---|---|---|
| 5,587,210 A | * | 12/1996 | Marchywka et al. | 427/523 |
| 5,702,586 A | | 12/1997 | Pehrsson et al. | |
| 2006/0099422 A1 | * | 5/2006 | Gussone et al. | 428/408 |

OTHER PUBLICATIONS

Chayahara, A. et al.; "The effect of nitrogen addition during high-rate homoepitaxial growth of diamond by microwave plasma CVD"; Diamond and Related Materials, vol. 13, 2004, pp. 1954-1958.

Mokuno, Y. et al.; "Synthesizing single-crystal diamond by repetition of high rate homoepitaxial growth by microwave plasma CVD"; Diamond and Related Materials, vol. 14, 2005, pp. 1743-1746.

Parikh, N.R. et al.; "Single-crystal diamond plate liftoff achieved by ion implantation and subsequent annealing"; Appl. Phys. Lett. vol. 61, No. 26, Dec. 28, 1992, pp. 3124-3126.

* cited by examiner

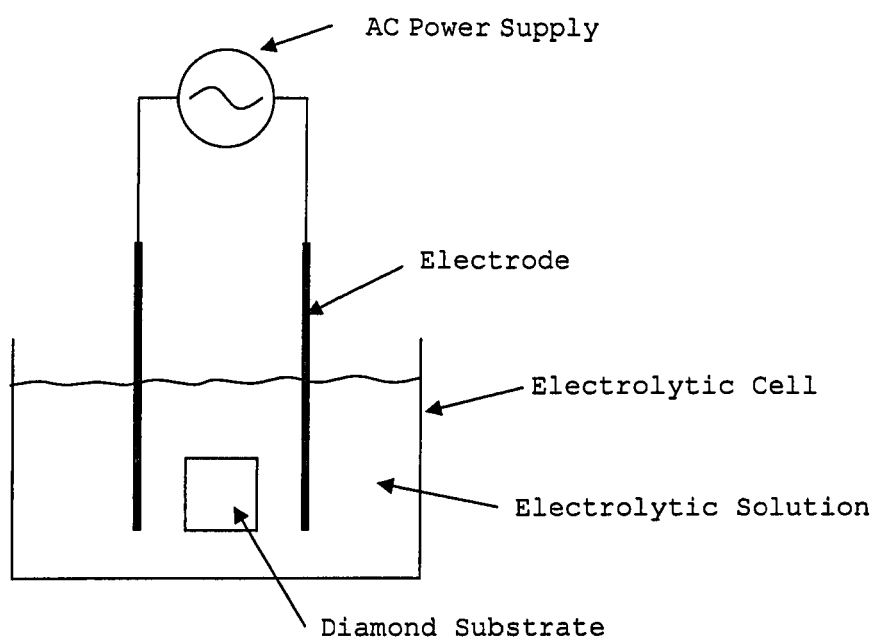

METHOD FOR SEPARATING SURFACE LAYER OR GROWTH LAYER OF DIAMOND

TECHNICAL FIELD

The present invention relates to a method for separating a surface layer or a growth layer of a diamond, such as a single-crystal diamond, a polycrystal diamond, or the like, which is widely used as tools, grindstones, substrates for electronic devices, etc.

BACKGROUND ART

Diamond is widely used as tools, grindstones, substrates for electronic devices, etc.

For all of these uses, the realization of large diamond substrates is desired. With polycrystal diamond substrates, large substrates exceeding 2 inches in size are already being produced. On the other hand, single-crystal diamond substrates are obtained by slicing a natural or synthetic single-crystal diamond by a method such as cleavage, sawing, laser cutting, or the like, and polishing the diamond, as required; however, large single-crystal diamonds are very expensive when they are natural. Further, when single-crystal diamonds are produced according to a high-temperature high-pressure synthesis method, the synthesis requires an extremely long time, and the yield decreases as the crystal size increases. Therefore, the size is limited to about 1×1 cm. For practical purposes, crystals with a size of up to about 5×5 mm are often used.

With the progression of high-rate growth techniques, the diamond growth technique by a vapor-phase synthesis method has enabled the growth of a diamond at a very high growth rate exceeding 100 µm/h (for example, Non-Patent Document 1). The synthesis of a bulk crystal with a thickness exceeding 1 cm has also been realized (for example, Non-Patent Document 2). Moreover, the vapor-phase synthesis methods have a feature in that the area on which crystals can be grown is easily expanded by enlarging diamond growth apparatuses. This enables growth on large substrates with a high yield by controlling the synthetic conditions and types of impurities to be added.

Hence, large single-crystal substrates can be produced at a high growth rate and a high yield by epitaxially growing a bulk crystal, by a vapor-phase synthesis method, on a large single-crystal substrate obtained from a large bulk crystal synthesized by a high-temperature high-pressure synthesis method, and then slicing the resulting bulk crystal. In this case, because the large crystal used as a seed is expensive and valuable, separation of the large single-crystal substrate from the vapor-phase synthetic diamond in a reusable form is strongly desired.

Furthermore, when single-crystal plates are sliced from the large bulk crystal synthesized by a vapor-phase synthesis method according to the above-described method, a cutting method such as laser cutting or sawing necessitates a cutting margin of several hundred microns with an increase in substrate size. This cutting margin corresponds to a thickness comparable to that of one semiconductor wafer. Thus, a cutting method that minimizes the cutting loss is required.

Parikh et al. have shown a method that potentially meets the above-described requirements, wherein oxygen ions accelerated to a high energy level of several megaelectron volts are implanted into a diamond to form a non-diamond layer, and then the non-diamond layer is removed by annealing in an oxygen atmosphere, thereby separating a single-crystal film with a thickness of the order of about microns from the substrate (see, for example, Non-Patent Document 3). However, as etching proceeds farther inside, the supply of oxygen that passes through the etched non-diamond layer decreases, thereby reducing the etching rate. For this reason, the size of the diamond used is as small as about 4×4 mm. If a sufficient amount of oxygen ions are implanted beforehand, oxygen can also be supplied from the inside of the crystal, allowing the etching of the non-diamond layer to proceed farther. However, because the ion dose increases, the surface layer of the diamond is damaged by radiation.

Marchywka et al. have proposed a method wherein a diamond film is epitaxially grown on an ion-implanted diamond substrate, after which electrochemical etching is performed by applying a direct-current (DC) voltage to remove the non-diamond layer formed by ion implantation, thereby separating the diamond film from the substrate (see, for example, Patent Document 1). Even in this case, however, as the substrate size increases, the etching rate inside the crystal decreases, thus requiring a very long period of time for etching. For this reason, the size of the diamond used is limited to from 2.5×2.5 mm to 4×4 mm, and application to substrates with a size exceeding this range is practically difficult.

Yamamoto et al. have proposed a method wherein a stacked film of a semiconducting diamond layer and an insulating diamond layer is epitaxially grown, or an insulating diamond layer is made conductive by ion implantation, and subsequently, the semiconducting diamond layer is subjected to electrochemical etching, or the ion-implanted layer is subjected to electrochemical etching or electric discharge machining, thereby separating the insulating diamond film (see, for example, Patent Document 2). This method also has the above-mentioned problem of electrochemical etching. Additionally, to form a semiconducting diamond layer necessary for electrochemical etching or electric discharge machining, it is necessary to form a layer doped with an impurity. A plurality of steps are thus required to ensure a satisfactory purity of the insulating diamond layer to be separated.

Patent Document 1: U.S. Pat. No. 5,587,210
Patent Document 2: Japanese Unexamined Patent Publication No. 2005-272197
Non-Patent Document 1: "The effect of nitrogen addition during high-rate homoepitaxial growth of diamond by microwave plasma CVD"; A. Chayahara, Y. Mokuno, Y. Horino, Y. Takasu, H. Kato, H. Yoshikawa, and N. Fujimori; *Diamond and Related Materials* 13 (2004) 1954-1958
Non-Patent Document 2: "Synthesizing single-crystal diamond by repetition of high rate homoepitaxial growth by microwave plasma CVD"; Y. Mokuno, A. Chayahara, Y. Soda, Y. Horino, and N. Fujimori; *Diamond and Related Materials* 14 (2005) 1743-1746.
Non-Patent Document 3: "Single-crystal diamond plate lift-off achieved by ion implantation and subsequent annealing"; N. R. Parikh, J. D. Hunn, E. McGucken, M. L. Swanson, C. W. White, R. A. Rudder, D. P. Malta, J. B. Posthill, and R. J. Markunas; *Appl. Phys. Lett.* 61 (1992) 3124-3126

DISCLOSURE OF THE INVENTION

Problems to be Solved by the Invention

The invention was made in view of the above-described state of the prior art. A principal object of the invention is to provide a novel method that is effective for separating a portion of diamond from various diamonds, such as a large single-crystal diamond substrate and the like, in a reusable form.

Another object of the invention is to provide a novel separation method capable of efficiently separating a grown diamond layer, which is grown on a diamond seed crystal by a vapor-phase synthesis method, in a short period of time; and more particularly, to provide such a method applicable to a large single-crystal diamond exceeding 5×5 mm in size.

Means for Solving the Invention

The inventors conducted extensive research to achieve these objects. Consequently, they found that, according to a method that includes forming a non-diamond layer in a single-crystal diamond by ion implantation, followed by performing etching in an electrolytic solution by applying an alternating-current (AC) voltage, even if a large single-crystal diamond substrate is used, etching proceeds extremely rapidly into the non-diamond layer of the crystal, thus allowing the single-crystal diamond at the surface side above the non-diamond layer to be separated in a short period of time. Moreover, according to a method that includes forming a non-diamond layer in a single-crystal diamond, growing a diamond on a surface of the single-crystal diamond by a vapor-phase synthesis method, and performing etching in an electrolytic solution by applying an AC voltage according to the above-described method, even if a large single-crystal diamond substrate is used, the grown diamond layer can be efficiently separated in a short period of time. Furthermore, the inventors found that the above-described methods for separating a surface layer or a grown layer of a single-crystal diamond are similarly applicable to a polycrystal diamond.

The invention was accomplished as a result of further extensive research based on these novel findings, and provides methods as set forth below for separating a surface layer or a grown layer of a diamond.

1. A method for separating a surface layer of a diamond, comprising implanting ions into a diamond to form a non-diamond layer near a surface of the diamond; and etching the non-diamond layer in the diamond by applying an alternating-current voltage across electrodes in an electrolytic solution.
2. The method according to Item 1, wherein the electric field strength of the alternating-current voltage applied across the electrodes is from 50 to 10,000 v/cm.
3. The method according to Item 1, wherein the diamond is a single-crystal diamond or a polycrystal diamond.
4. A method for separating a grown layer of a diamond, comprising implanting ions into a diamond to form a non-diamond layer near a surface of the diamond; growing a diamond on the surface of the diamond by a vapor-phase synthesis method; and etching the non-diamond layer in the diamond by applying an alternating-current voltage across electrodes in an electrolytic solution.
5. The method according to Item 4, wherein the electric field strength of the alternating-current voltage applied across the electrodes is from 50 to 10,000 v/cm.
6. The method according to Item 4, wherein the diamond is a single-crystal diamond or a polycrystal diamond.

Effects of the Invention

According to the method of the invention for separating a surface layer of a diamond, a single-crystal diamond or a polycrystal diamond, is used as a raw material, and a non-diamond layer is formed in the diamond, after which etching is performed by applying an alternating-current (AC) voltage, thereby allowing a surface portion of the diamond to be separated in a short period of time.

Further, a diamond is grown on a diamond seed crystal of a single-crystal diamond or a polycrystal diamond by a vapor-phase synthesis method, after which the above-described etching method is applied, thereby allowing the diamond film grown on the seed crystal to be separated in a short period of time. In this way, even a large single-crystal diamond substrate exceeding 5×5 mm in size can be produced easily in a short period of time. According to this method, the seed crystal used in the production of a diamond or the resulting diamond substrate can be reused as a seed crystal. Thus, the number of substrates produced can be dramatically increased, enabling production of substrates at low cost and in large quantities.

BRIEF DESCRIPTION OF THE DRAWINGS

FIG. 1 is a schematic diagram showing an etching method according to the invention.

BEST MODE FOR CARRYING OUT THE INVENTION

According to the method of the invention for separating a surface layer of a diamond, a non-diamond layer is formed near a surface of a diamond by an ion implantation method, after which the non-diamond layer is etched by applying an AC voltage in an electrolytic solution, thereby allowing the diamond at the surface side above the non-diamond layer to be easily separated.

Further, according to the method wherein a non-diamond layer is formed in a diamond, and then a diamond is grown on a surface of the diamond by a vapor-phase synthesis method, after which the non-diamond layer is etched by applying an AC voltage in an electrolytic solution using the above-described method, the diamond grown by the vapor-phase synthesis can be efficiently separated in a short period of time.

These methods are hereinafter described in detail.

Diamond (Substrate)

The diamond for use as a substrate may be any diamond with insulating properties; any diamond, such as natural or synthetic, can be used. The diamond may be a single-crystal diamond or a polycrystal diamond.

When a single-crystal diamond is used as a substrate, and ion implantation is performed, after which a single-crystal diamond is grown on a surface of the single-crystal diamond by a vapor-phase synthesis method, a single-crystal diamond having a crystal face capable of epitaxial growth, such as the (100) face, (111) face, or the like, may be used as a single-crystal diamond. A diamond material having a surface with an angle of inclination, i.e., an off-angle, with respect to the above-mentioned crystal face capable of epitaxial growth (the diamond material is referred to as an "off-substrate"), may also be used.

The degree of the off-angle is not limited, and may be an angle of inclination such that crystal growth is enabled by step-flow growth. When the (100) plane, (111) plane, or a like plane of the diamond is used as a reference crystal plane, the off-angle is preferably, for example, from about 0.05 to about 10°, and more preferably from about 0.05 to about 5°.

The method of forming an off-angle is not limited; for example, a predetermined off-angle may be formed according to a conventional method such as mechanical polishing etc. For example, methods such as scaife polishing, wherein polishing is performed by pressing the diamond against a rapidly rotating cast-iron plate (a scaife), can be employed.

Moreover, a substrate with certain orientation may be used as a single-crystal substrate. More specifically, for example, an oriented single-crystal diamond substrate, which is obtained by heteroepitaxial growth on a different kind of substrate; or a substrate obtained by arranging a plurality of single-crystal substrates in the form of tiles, or by bonding these substrates by a vapor-phase synthesis method or the like may be used.

When, after the ion implantation, a polycrystal diamond is grown by a vapor-phase synthesis method, a polycrystal substrate may be used.

Formation of Non-Diamond Layer in Diamond

A non-diamond layer can be formed in a diamond by ion implantation. In this step, ions are implanted into the diamond from one surface thereof, thereby forming a non-diamond layer having a deteriorated crystal structure near the surface of the diamond.

The ion implantation method is a method of irradiating a sample with swift ions. In general, ion implantation is performed as follows: a desired element is ionized, and a voltage is applied to the resulting ions to accelerate the ions in an electric field, after which the ions are mass-separated, and ions with a desired level of energy are directed to the sample. Alternatively, it may be performed by plasma ion implantation, wherein the sample is immersed in plasma, and negative high-voltage pulses are applied to the sample to attract positive ions in the plasma to the sample. Examples of implanted ions include carbon, oxygen, argon, helium, protons, and the like.

The ion implantation energy may be in the range of from about 10 keV to about 10 MeV, which is typically used in ion implantation. Implanted ions are distributed mainly in an average depth (projectile range), with a certain width of depth; the average depth is determined according to the type and energy of the ions, as well as the type of the sample. Damage to the sample is maximized in the vicinity of the projectile range where ions stop, but the surface side of the substrate above the vicinity of the projectile range also experiences a certain degree of damage caused by the passage of ions. The projectile range and the degree of damage can be calculated and predicted using a Monte Carlo simulation code, such as the SRIM code.

By implanting ions into the substrate, when the dose exceeds a certain level, the surface side of the substrate above the vicinity of the projectile range undergoes a chemical or physical change to deteriorate the crystal structure. The diamond structure is thus destroyed, causing graphitization to proceed, thereby facilitating the separation of the surface portion above the deteriorated portion.

The depth and thickness of the resulting deteriorated portion vary depending on the type of ion used, the ion implantation energy, the dose, and the like. Therefore, these conditions are determined so that a deteriorated layer that can be separated is formed in the vicinity of the projectile range. When a diamond is grown by vapor-phase synthesis on a surface of an ion-implanted diamond substrate, in particular, in an attempt to grow a single-crystal diamond on a single-crystal substrate, the conditions for the surface of the single-crystal substrate should be determined so that the surface can maintain a degree of crystallinity such that epitaxial growth is enabled by a vapor-phase synthesis method. More specifically, in a region with the highest atomic density of implanted ions, the atomic density is preferably about $1\times10^{20}$ atoms/$cm^3$ or more. In order to ensure the formation of a non-diamond layer, the atomic density is preferably about $1\times10^{21}$ atoms/$cm^3$ or more, i.e., a displacement damage of 1 dpa or more. The degree of damage to the surface capable of epitaxial growth is preferably such that the displacement damage near the surface of the diamond is about 0.6 dpa ($1\times10^{23}$ (vacancies)/$cm^3$) or less, and more preferably about 0.2 dpa ($4\times10^{22}$ (vacancies)/$cm^3$) or less.

For example, when carbon ions are implanted at an implantation energy of 3 MeV, the ion dose may be from about $1\times10^{16}$ ions/$cm^2$ to about $1\times10^{17}$ ions/$cm^2$. In this case, if the ion dose is too high, the crystallinity of the surface deteriorates, making epitaxial growth difficult; whereas if the dose is too low, a non-diamond layer is not formed sufficiently, making it difficult to separate the diamond layer.

After the ion implantation, if the diamond is heat-treated at a temperature of 600° C. or higher in vacuum or in an oxygen-free inert gas atmosphere, graphitization of the non-diamond layer proceeds, allowing etching in the subsequent step to proceed more rapidly. The upper limit for the heat-treatment temperature is the temperature at which the diamond begins to graphitize, which is typically about 1,500° C. The heat-treatment time varies depending on the treatment conditions, such as the heat-treatment temperature and the like; for example, it may be from about 5 minutes to about 10 hours.

When a diamond is grown by vapor-phase synthesis on a surface of a diamond, the substrate temperature is typically maintained at 900° C. or more during growth; therefore, even if the heat treatment is not applied, graphitization of a non-diamond layer can proceed.

Etching of Non-Diamond Layer

Subsequent to the formation of a non-diamond layer using ion implantation according to the above-described method, etching is performed by applying an AC voltage in an electrolytic solution. This causes etching to proceed at the portion of the non-diamond layer, in which graphitization has proceeded to increase the electrical conductivity, thereby separating the surface layer from the portion of the non-diamond layer. At this time, it is not clear whether the non-diamond layer is being etched electrochemically or by microplasma; thus, the term "electrolytic solution" means a liquid used in the etching treatment.

FIG. 1 is a schematic diagram showing an etching method for a non-diamond layer. In the method shown in FIG. 1, two electrodes are disposed in an electrolytic solution at a certain interval. Next, a diamond containing a non-diamond layer is placed at a given position between these electrodes, and an AC voltage is applied across the electrodes.

Pure water with a low conductivity is preferable as an electrolytic solution. While the electrode material may be any conductive material, chemically stable electrodes, such as platinum, graphite, or the like, are preferable.

The electrode interval and the applied voltage may be adjusted to allow the etching to proceed most rapidly. The electric field strength in the electrolytic solution, which is determined by dividing the applied voltage by the electrode interval, may be typically from about 50 to about 10,000 V/cm; more preferably, a high voltage of from about 500 to about 10,000 v/cm is applied. At this time, if the electric field strength is too high; more specifically, if the applied voltage is too high, or the interval between the electrodes is too short, a discharge can be sometimes visually observed at the end portions of the non-diamond layer proximate to the electrodes. In this case, it is presumed that a phenomenon similar to so-called electric discharge machining is occurring; although the etching rate increases, the separated face becomes rough, and a shell-like pattern (an annual-ring pattern) remains thereon, so that this phenomenon is undesirable when intending to obtain a flat separated face. This is not the case, however, where it is more important to increase the etching rate.

While a commercial sinusoidal alternating current with a frequency of 60 or 50 Hz is readily available as an alternating current, the waveform is not limited to a sinusoidal waveform, as long as the current has a similar frequency component.

Pure water used as an electrolytic solution advantageously has a higher resistivity (i.e., a lower conductivity) to allow the application of a higher voltage. Ultrapure water produced using a general ultrapure water-producing apparatus has a sufficiently high resistivity, about 18 MΩ·cm, and is thus suitable for use as an electrolytic solution. Even when ultrapure water is used as an electrolytic solution, the etching treatment causes a rise in temperature of the electrolytic solution, because the solution is heated by the applied voltage and current. This reduces the resistivity of the pure water to increase the current. When the power supply source has a current-limiting function, as with a neon-sign transformer, the voltage decreases as the current increases; thus, it is not preferable to elevate the liquid temperature excessively.

The apparatus containing the electrolytic solution preferably has a sealed structure, because the resistivity of pure water decreases with time due to the absorption of carbon dioxide in the air, etc. If the resistivity is low, the application of a high voltage causes a large current to flow, thereby greatly increasing the temperature of the electrolytic solution and causing boiling. This is not preferable, because the amount of the electrolytic solution decreases with evaporation.

For example, when a pair of platinum electrodes with a diameter of 0.5 mm, a length of 5 cm (the length in the electrolytic solution), and an interval of 1 cm are immersed in 400 cc of ultrapure water (the electrolytic solution) with 18 MΩ·cm at 20 to 30° C. in an uncooled glass beaker, and an AC voltage with a voltage of 6 to 8 kV and a frequency of 60 Hz is applied with a 12 kV-rated neon-sign transformer, the temperature of the electrolytic solution is elevated to a temperature of 60 to 70° C., and the voltage at that time decreases to a voltage of 4 to 2 kV.

According to the above-described method of applying an AC voltage, unlike electrochemical etching by the application of a DC voltage, substantially no hydrogen or oxygen bubbles are formed. This facilitates the application of a high voltage (a high electric field), and obviates a reduction in the etching rate due to the entry of bubbles into the gap between the substrate and the surface layer, which prevents the electrolytic solution from contacting the non-diamond layer. Although the reason why the etching proceeds rapidly into a large substrate is unclear, one possible factor is because the amount of active species in the electrolytic solution increases as a result of preventing the formation of bubbles at the electrodes.

Through the above-described separation step, the diamond layer present at the surface side above the non-diamond layer is separated from the substrate.

Further, by way of a method that includes forming a non-diamond layer in a diamond by ion implantation, growing a diamond on a surface of the diamond by a vapor-phase synthesis method, and performing etching by applying an AC voltage according to the above-described method, the crystal at the surface side above the non-diamond layer of the diamond (the seed crystal) and the diamond grown by vapor-phase synthesis can be separated from the seed crystal. A diamond growth method by a vapor-phase synthesis method is described below.

Diamond Crystal Growth by a Vapor-Phase Synthesis Method

The vapor-phase synthesis method is not limited; a known method is applicable, such as, for example, a microwave plasma CVD method, a hot filament method, a DC discharge method, etc.

Using, in particular, a microwave plasma CVD method, a high-purity diamond film can be grown. Specific production conditions are not limited; a diamond can be grown according to known conditions. As a source gas, for example, a gas mixture of methane and hydrogen can be used. Moreover, the addition of nitrogen gas thereto can dramatically increase the growth rate, and can substantially eliminate the occurrence of non-epitaxial crystallites and hillocks, especially in the case of single-crystal growth, thus enabling the growth of a single-crystal diamond having a thickness necessary for a substrate (about 300 μm) with a high yield and in a short period of time.

Specific conditions for growing a diamond are now described by way of example. In the gas mixture of hydrogen, methane, and nitrogen used as a reaction gas, methane is preferably supplied in a proportion of from about 0.01 to about 0.33 mol per mol of hydrogen supplied, and nitrogen is preferably supplied in a proportion of from about 0.0005 to about 0.1 mol per mol of methane supplied. The pressure inside the plasma CVD apparatus can be typically from about 13.3 to about 40 kPa. Microwaves typically used are those having a frequency of 2.45 GHz, 915 MHz, or like frequencies that are industrially or scientifically sanctioned. The microwave power is not limited, and is typically from about 0.5 to about 5 kW. Within these ranges, the conditions may be adjusted so that the temperature of the diamond substrate is from about 900 to about 1,300° C. Maintaining the substrate at such temperatures promotes the graphitization of the non-diamond layer formed by ion implantation.

Separated Diamond

The diamond separated by the above-described etching can be effectively used for various purposes. For example, the thus-separated single-crystal diamond can be effectively used as tools, grindstones, substrates for electronic devices, etc.

In particular, when a diamond is grown by a vapor-phase synthesis method, and then the grown diamond layer is separated by etching, the combination of the rapid diamond growth by a vapor-phase synthesis method and the separation step by the application of an AC voltage in a short period of time enables even a large single-crystal diamond exceeding 5 mm in size to be produced easily and in a short period.

The diamond produced by this method has a portion of the seed crystal with a thickness about equal to the depth of the ion-implanted layer remaining on the rear surface (the separated face) thereof. Because this portion has been damaged to a certain degree by ion implantation, it may be removed, as required, by polishing methods such as scaife polishing or the like. Since the amount of final polishing is typically about several micrometers or less, the portion can be removed within an extremely short period of time.

In addition to the various purposes mentioned above, the diamond separated according to the method of the invention can be effectively used as a seed substrate for the vapor-phase synthesis of a diamond.

Moreover, the seed crystal can be reused as a substrate in the same method by re-polishing the surface thereof, as required; it can be repeatedly reused the number of times determined according to the value obtained by dividing the substrate thickness by the depth of the ion-implanted layer. Furthermore, following the same method, a diamond substrate can be further reproduced from the separated and reproduced substrate. Consequently, the number of diamond substrates produced can be dramatically increased.

The invention is described in greater detail below with reference to the Examples.

Example 1

A high-temperature high-pressure synthetic Ib diamond (100) substrate with a size of 9.3×9.5×1.05 mm$^3$ was used as a substrate, and carbon ions were implanted into the substrate at an implantation energy of 3 MeV and a dose of $2\times10^{16}$ ions/cm$^2$, using a 1.5 MV tandem accelerator. The projectile range of the implanted ions was calculated using a Monte Carlo simulation code, and the result was about 1.6 µm. As a result of this irradiation, the color of the diamond substrate changed from a pale yellow to black; this confirmed that a non-diamond layer had been formed.

The ion-implanted substrate was placed in a commercially available microwave plasma CVD apparatus, after which hydrogen gas was introduced into the CVD chamber, and microwave power was applied to generate plasma. The microwave power was set to about 3 kW, with the hydrogen gas flow rate set at 500 sccm and the pressure at 24 kPa, so that the substrate temperature was 1,130° C., and these conditions were maintained for 10 minutes. This step is intended to clean the surface of the diamond substrate by exposure to hydrogen plasma, and stabilize conditions such as temperature and the like inside the CVD chamber.

Next, 60 sccm of methane gas and 0.6 sccm of nitrogen gas were introduced into the CVD chamber, and diamond growth was initiated. During the growth, the microwave power was adjusted so that the temperature of the diamond substrate was maintained at 1,130° C. After the introduction of the methane gas, the conditions were maintained for 600 minutes to grow a crystal, and then the crystal growth was completed by stopping the methane gas.

After growing a single-crystal diamond according to the above-described method, the diamond deposited around the ion-implanted layer on the substrate-side surface was removed by laser cutting, and etching was performed according to the following method.

First, two separate platinum electrodes were disposed at an interval of about 1 cm in a beaker containing pure water, and the substrate on which the single-crystal diamond had grown was placed between the electrodes. An AC voltage with an effective value of 5.6 kV and a frequency of 60 Hz was applied across the electrodes, and the substrate was allowed to stand for 15 hours; as a result, the black non-diamond layer had disappeared when visually observed. Because of the possibility that the non-diamond layer that could not be visually observed still remained, the application of an AC current was continued for another 24 hours under the same conditions. As a result, the diamond grown layer was separated from the substrate.

The thickness of the separated diamond grown layer was measured using a micrometer, and the resulting thickness was 360 µm, which substantially coincided with the growth film thickness of diamond.

Example 2

A diamond was produced by growing a vapor-phase synthetic diamond to a thickness of 8.7 mm on a high-temperature high-pressure synthetic Ib diamond (100) substrate with a size of about 6×6 mm according to a microwave plasma CVD method. The resulting bulk single crystal was sliced along the (100) plane perpendicular to the growth face, and the surface of the slice was polished to prepare a single-crystal diamond substrate in the form of a 6×8.5×1.02 mm$^3$ trapezoid. Using this substrate, ion implantation and epitaxial growth of a diamond by a microwave plasma CVD method were performed according to the same method as Example 1.

After the growth, the diamond deposited around the ion-implanted layer on the substrate-side surface was removed by laser cutting, and etching was performed in the same manner as Example 1. An AC voltage with an effective value of 5.6 kV and a frequency of 60 Hz was applied across the electrodes, using pure water as an electrolytic solution, with the electrode interval set to about 1 cm. After the substrate had been allowed to stand for 15 hours, the black non-diamond layer had disappeared when visually observed. Because of the possibility that the non-diamond layer that could not be visually observed still remained, the application of an AC current was continued for another 24 hours under the same conditions. As a result, the diamond grown layer was separated from the substrate.

The thickness of the separated diamond grown layer was measured using a micrometer, and the resulting thickness was 300 µm, which substantially coincided with the growth film thickness of diamond.

Comparative Example 1

Using a high-temperature high-pressure synthetic Ib diamond (100) substrate with a size of 9.3×9.5×1.05 mm$^3$, ion implantation and diamond growth by a microwave CVD method were performed according to the same method as Example 1, and the diamond deposited around the ion-implanted layer on the substrate-side surface was removed by laser cutting.

Next, using the same electrolytic apparatus as that of Example 1, the substrate on which the single-crystal diamond had grown was placed between the electrodes, and a DC voltage of 330 V was applied across the electrodes in pure water. Although the substrate was allowed to stand for about 3 days, the black non-diamond layer was etched only to an inside depth of about 1.5 mm from the periphery of the crystal; thus, the diamond grown layer was not separated.

Example 3

The surface (the separated face) of the high-temperature high-pressure synthetic Ib diamond (100) substrate, i.e., the surface from which the diamond grown layer was separated in Example 1, was subjected to ion implantation and diamond growth by a microwave CVD method according to the same method as Example 1.

After the growth of a single-crystal diamond, the diamond deposited around the ion-implanted layer on the substrate-side surface was removed by laser cutting, and etching was performed by applying an AC voltage in pure water as in Example 1, thereby separating the diamond grown layer from the substrate. As a result, a CVD diamond plate with a thickness of about 400 µm was separated.

As a result of repeating this method three times, CVD diamond plates of similar thicknesses were successfully separated.

Example 4

A high-temperature high-pressure synthetic Ib diamond substrate with a size of 9.8×9.7×1.7 mm$^3$, whose surface had been polished to have an off-angle of 3.8° from the (100) plane, was used as a substrate, and ion implantation and diamond growth by a microwave CVD method were performed according to the same method as Example 1.

After the growth of a single-crystal diamond, the diamond deposited around the ion-implanted layer on the substrate-side surface was removed by laser cutting, and etching was performed by applying an AC voltage in pure water as in Example 1, thereby separating the diamond grown layer from the substrate. As a result, a CVD diamond plate with a thickness of about 400 μm was separated.

Example 5

A mirror-polished polycrystal diamond substrate with a size of 10×10×0.3 mm³ was used as a substrate, and ion implantation was performed according to the same method as Example 1.

The ion-implanted substrate was placed in a commercially available microwave plasma CVD apparatus, and the growth of a polycrystal diamond was initiated at a hydrogen gas flow rate of 532 sccm, a methane gas flow rate of 60 sccm, an oxygen gas flow rate of 9 sccm, a pressure of 16 kPa, and a microwave power of 5 kW. At the time, the substrate temperature was measured with a pyrometer, and the resulting temperature was 1,000° C. These conditions were maintained for 3 days, and the crystal growth was completed by stopping the supply of methane gas.

After the growth of a polycrystal diamond according to the above-described method, the diamond deposited around the ion-implanted layer on the substrate-side surface was removed by laser cutting, and etching was performed by applying an AC voltage in pure water as in Example 1, thereby separating the diamond grown layer from the substrate. As a result, a CVD polycrystal diamond plate with a thickness of about 1 mm was separated.

The separated faces of the substrate and the separated polycrystal plate were mirror-finished, and had the same surface morphology when observed with a differential interference contrast microscope.

The invention claimed is:

1. A method for separating a surface layer of a diamond, comprising:
    implanting ions into a diamond to form a non-diamond layer near a surface of the diamond; and
    etching the non-diamond layer in the diamond by applying an alternating-current voltage across electrodes in pure water,
    wherein the electric field strength of the alternating-current voltage applied across the electrodes is from about 500 to about 10,000 v/cm.

2. The method according to claim 1, wherein the diamond is a single-crystal diamond or a polycrystal diamond.

3. The method according to claim 1, wherein the pure water is produced by using an ultrapure water-producing apparatus.

4. The method according to claim 1, wherein the pure water has a sufficiently high resistivity of about 18 MΩ·cm.

5. The method according to claim 1, wherein the diamond is placed between the electrodes.

6. A method for separating a grown layer of a diamond, comprising:
    implanting ions into a diamond to form a non-diamond layer near a surface of the diamond;
    growing a diamond on the surface of the diamond by a vapor-phase synthesis method; and
    etching the non-diamond layer in the diamond by applying an alternating-current voltage across electrodes in pure water,
    wherein the electric field strength of the alternating-current voltage applied across the electrodes is from about 500 to about 10,000 v/cm.

7. The method according to claim 6, wherein the diamond is a single-crystal diamond or a polycrystal diamond.

8. The method according to claim 6, wherein the pure water is produced by using an ultrapure water-producing apparatus.

9. The method according to claim 6, wherein the pure water has a sufficiently high resistivity of about 18 MΩ·cm.

10. The method according to claim 6, wherein the diamond is placed between the electrodes.

* * * * *